United States Patent
Kamiya

(10) Patent No.: US 6,741,358 B1
(45) Date of Patent: May 25, 2004

(54) EXPOSURE APPARATUS AND DEVICE PRODUCTION METHOD IN WHICH POSITION OF REFERENCE PLATE PROVIDED ON SUBSTRATE STAGE IS MEASURED

(75) Inventor: Saburo Kamiya, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/661,433

(22) Filed: Sep. 13, 2000

(30) Foreign Application Priority Data

Sep. 20, 1999 (JP) .......................... 11-265669
Aug. 29, 2000 (JP) ...................... 2000-259147

(51) Int. Cl.⁷ .............................................. G01B 9/02
(52) U.S. Cl. ..................................................... 356/500
(58) Field of Search ................... 356/485, 486, 356/487, 490, 498, 500, 505, 510, 509; 250/548; 355/53

(56) References Cited

U.S. PATENT DOCUMENTS 4,787,747 A    11/1988    Sommargren et al.
4,836,678 A    6/1989     Okaji
5,117,254 A    5/1992     Kawashima et al.
5,137,349 A    8/1992     Taniguchi et al.
6,285,444 B1   9/2001     Osanai et al.
6,285,457 B2 * 9/2001     Ukaji ........................ 356/500

FOREIGN PATENT DOCUMENTS

JP    A-8-241849    9/1996
WO    WO 99/28790   * 6/1999
WO    WO 99/32940   * 7/1999

* cited by examiner

*Primary Examiner*—Samuel A. Turner
(74) *Attorney, Agent, or Firm*—Oliff & Berridge, PLC

(57) ABSTRACT

An exposure apparatus which transfers a pattern image formed on a mask on to a substrate through a projection optical system, comprising a substrate table which holds said substrate, a first sensor which measures a gap between said substrate surface held by said substrate table and a control target position, and a second sensor which measures a distance between said projection optical system and said substrate table in an optical axis direction and corrects the control target position of said first sensor.

26 Claims, 3 Drawing Sheets

EXPOSURE APPARATUS AND DEVICE PRODUCTION METHOD IN WHICH POSITION OF REFERENCE PLATE PROVIDED ON SUBSTRATE STAGE IS MEASURED

BACKGROUND OF THE INVENTION

1. Field of the Invention

The present invention relates to an exposure apparatus used in photolithography processing for producing a variety of micro devices, such as semiconductor devices, image pickup devices, liquid crystal display devices and thin film magnetic head, particularly relates to an exposure apparatus capable of correcting changes of automatic-focusing sensor system accurately at a high speed.

2. Description of the Related Art

In a photolithography processing of producing semiconductor devices, an exposure apparatus of a step-and-repeat type is widely used wherein a mask pattern is transferred on a wafer or glass plate (hereinafter, also referred to as a substrate) coated with photo resist. The step-and-repeat type exposure apparatus exposes a shot region by projecting at one time a reduced image of a mask pattern on the shot region on a wafer. When an exposure on one shot region is completed, the wafer is moved by a step and the next shot region is exposed. Since this process is repeated successively, it is called a step-and-repeat type.

While, in order to expand the exposure region of the mask pattern, a step-and-scan type exposure apparatus has been also developed wherein an exposure light from a illumination system is limited to be a slit shape (rectangular shape), and a mask and a wafer are scanned in synchronization with respect to a projection optical system in a state that a part of the mask pattern is reduced and projected on the wafer by using the slit light. The step-and-scan type exposure apparatus has both merits of a transfer mode of an aligner for transferring a full-scale pattern of overall surface of the mask on the wafer by one-time scan exposure and merits of the above transfer mode of the stepper.

In such kinds of exposure apparatuses, focusing is performed before exposure and during exposure. As a focusing method of a substrate coated with a photo-resist material, a method of using a so-called automatic focusing sensor is known.

In adjusting focus by the automatic focusing sensor, a height of a substrate surface (a position in the optical axis direction of a projection optical system) is detected by fixing a projector and a light receiver as an optical sensor on a frame on which a projection optical system is set, irradiating a light obliquely on the substrate surface from the projector, and receiving a reflected light from the substrate surface by the light receiver. Then, the position of the substrate stage in the optical axis direction is controlled by a signal therefrom to adjust the focus of the projection optical system on the substrate surface.

In the above focus adjusting method using the automatic focusing sensor, however, positions are not adjusted directly with respect to the substrate surface by detecting a focal position of an actual mask pattern image, but by measuring a gap between a control target position of the automatic focusing sensor and the substrate surface, and using and controlling it as a gap between the focal position of the projection optical system and the substrate surface. Thus, there is a disadvantage that an optical and mechanical drift of the automatic focusing sensor as it is becomes an error of adjusting focuses.

Namely, adjusting focus by the above automatic focusing sensor is performed not by directly measuring a gap between a focal position of the projection optical system and the substrate surface, but by measuring a gap between the control target position of the automatic focusing sensor and the substrate surface, and by making the control target position of the automatic focusing sensor and the substrate surface almost the same based on the measurement result so as to the substrate surface is adjusted to the focal position of the projection optical system.

Accordingly, if a relative position of the projection optical system and the automatic focusing sensor deviates for some reason, sometimes exposure is performed in a state the projection optical system does not focus on the substrate surface (an exposure surface of the substrate) even when a measured value of the gap detected by the automatic focusing sensor is within an appropriate range.

Therefore, a method of calibration of the automatic focusing sensor by detecting a focal position of the actual mask pattern image is sometimes applied, but there are many disadvantages in an actual use, such that detection of the focal position of the pattern image takes time, and high resolution cannot be expected in terms of its precision.

SUMMARY OF THE INVENTION

An object of the present invention is to provide an exposure apparatus capable of correcting changes of an automatic focus sensor system at high precision and a high speed.

Another object of the present invention is to provide an exposure apparatus capable of correctly setting a focal position (an image forming position of a pattern image) of a projection optical system and a substrate surface as a desired state when projecting a mask pattern image on to the substrate through the projection optical system.

According to the present invention, there is provided an exposure apparatus for transferring a pattern image formed on a mask on to a substrate through a projection optical system, comprising a substrate table which holds the substrate, a first sensor which measures a gap between the substrate surface held by a substrate table and a predetermined control target position, and a second sensor for measuring a distance between the projection optical system and the substrate table in an optical axis direction and correcting the control target position of the first sensor.

According to the present invention, even if the first sensor optically or mechanically moves with respect to the projection optical system, a distance between the projection optical system and the substrate table in the optical axis direction is measured by the second sensor, and the control target position of the first sensor is corrected based on the measurement result, thus, an exposure apparatus capable of correcting the moves of the first sensor at high precision and a high speed can be provided.

BRIEF DESCRIPTION OF THE DRAWINGS

These and other objects and features of the present invention will become clearer from the following description of the preferred embodiments given with reference to the attached drawings, in which.

DESCRIPTION OF THE PREFERRED EMBODIMENTS

Below, preferred embodiments of the present invention will be explained with reference to the drawings.

First Embodiment

Figure 1:
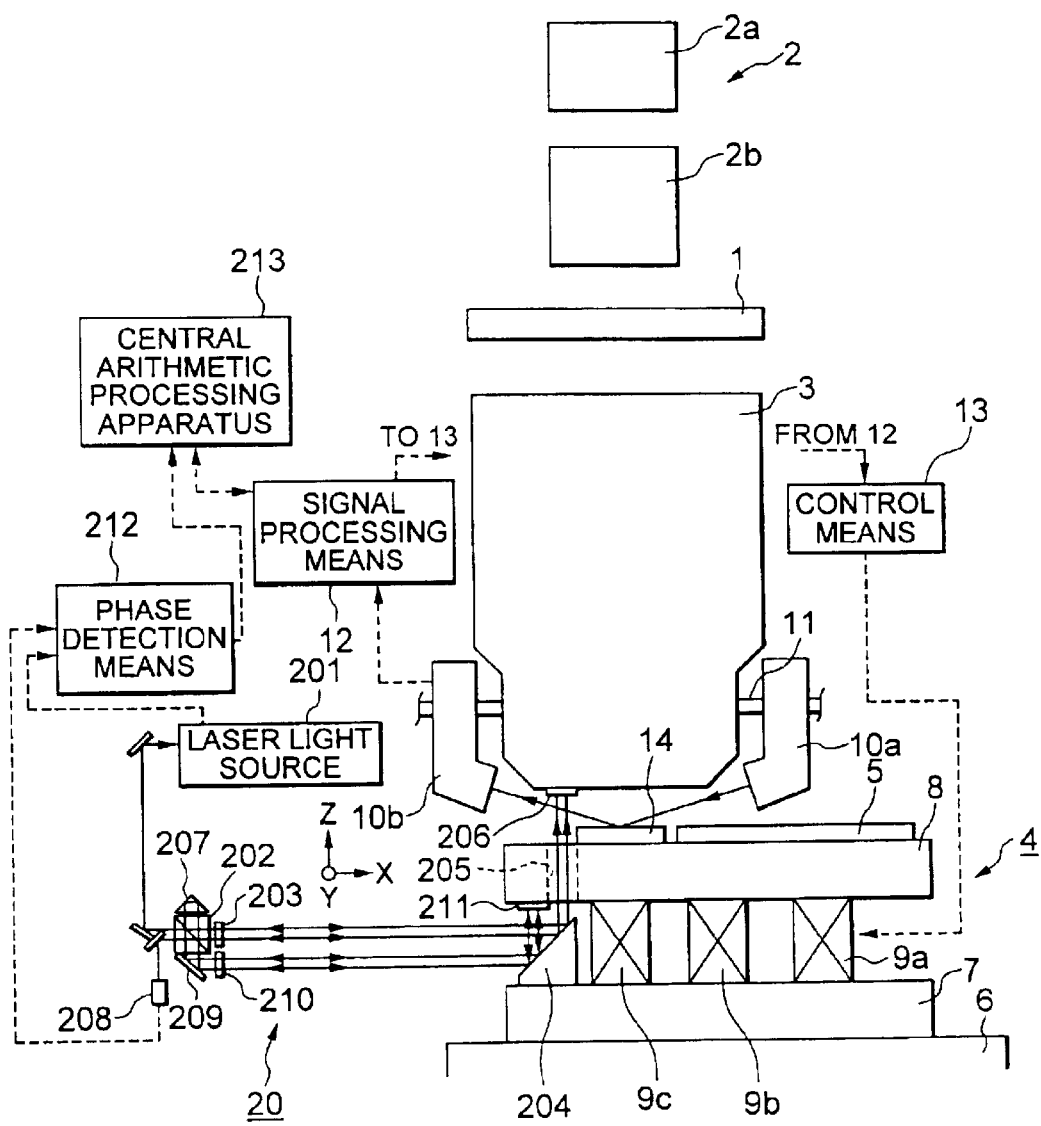
FIG. 1 is a schematic view of an exposure apparatus according to a first embodiment of the present invention.

FIG. 1 is a schematic view of an embodiment of an exposure apparatus of the present invention. A circuit pattern of a mask 1 as a master is irradiated by an illumination device 2 and the image is projected on a surface of a substrate 5 mounted on a substrate stage 4 via a projection optical system 3. Thereby, the circuit pattern of the mask 1 is transferred on the substrate 5.

A light source 2a of the illumination device 2 emits pulses of an illumination light for exposure, and for example, an ultraviolet pulse light from KrF exima laser light source having a wavelength of 248 nm, an ultraviolet pulse light from an ArF exima laser light source having a wavelength of 193 nm, and an ultraviolet ray of a pulse laser from a YAG laser light source converted to be harmonics, etc. can be used.

A light emitted from the light source 2a uniformly irradiate on the mask 1 via the illumination optical system 2b. While a detailed illustration is omitted, in the illumination optical system 2b, the light from the light source 2a is irradiated on a shaping optical system via a rotary shutter, the illumination light passed through the shaping optical system irradiates a fly-eye lens system functioning as an optical integrator, and a number of secondary light source images are uniformly distributed in a almost square or circular region as a whole on the exit side of the fly-eye lens system. On the exit side of the fly-eye lens system is arranged a stop switching member having a plurality of illumination σ (sigma) stops for changing a substantial shape of the secondary light source image to a ring, small circular, normal circular, four-aperture, etc. The switching member is driven by a motor to be able to switched to a desired illumination a stop.

Then, an illumination light having a uniformed illumination distribution transmitted through the illumination a stop passes a beam splitter having a reflection coefficient of about 10% or less, is reflected on a mirror, irradiates on a relay lens system and on a movable reticle blind for determining a shape and position of an illumination region on the mask 1. An illumination light transmitted through an aperture of the reticle blind irradiates on a circuit pattern region of the mask 1 with a uniformed intensity distribution via the relay lens system, mirror, main condenser lens system, etc.

The mask 1 is held in parallel with an XY plane on the mask stage via a not shown mask holder. A circuit pattern to be transferred is formed on the mask 1, and for example in the case of a step-and-scan type exposure apparatus, a rectangular (slit) shaped illumination region having a long side along the Y-direction and a short side along the X-direction in the overall pattern region is irradiated. Note that the not shown mask stage is two-dimensionally movable along the mask plane (XY plane) by a drive system, and the positional coordinates are measured by an interferometer using a mirror provided on the mask stage and the position is controlled.

A light from a pattern formed on the mask 1 forms a mask pattern image on the photosensitive substrate 5 via the projection optical system 3. The substrate 5 is held in parallel with the XY plane on the substrate stage 4 via the substrate table 8. A pattern image is formed on a rectangular shaped exposure region having a long side along the Y direction and a short side along with the X direction on the substrate 5 so as to optically correspond to the rectangular illumination region on the mask 1.

The substrate stage 4 is provided on a base 6 and driven by a not shown drive apparatus on the XY plane. The substrate stage 4 comprises a substrate table 8 for loading the substrate 5, a movable plate 7, and Z-axis drives 9a, 9b and 9c for driving the substrate table 8 in the z-axis direction relative to the movable plate 7. The Z-axis drives 9a, 9b and 9c support the substrate table 8 by three drive systems which are not aligned on one straight line. By driving the Z-axis drives 9a, 9b and 9c for a same amount, a position of the substrate table in the Z-axis direction can be adjusted, and the substrate table 8 can be inclined by changing the drive amount. As a result, a surface of the substrate 5 can be adjusted at a projection image position (image forming position of the pattern image) of the mask 1 at high precision. Note that, while not illustrated, the substrate stage 4 is movable two-dimensionally along the XY plane due to an action of another drive system, and the positional coordinates are measured by an interferometer using a mirror provided on the substrate table 8 and the position is controlled.

A position of the substrate 5 in the Z-axis direction is detected by automatic focusing sensor 10a and 10b. The automatic focusing sensor 10a and 10b comprise a light transmitting optical system 10a and a light receiving optical system 10b provided at a symmetrical position with respect to an optical axis of the projection optical system 3, which are fixed on a frame 11 having the projection optical system 3 provided thereon. Then a light beam emitted from the light transmitting optical system 10a is reflected on the surface of the substrate 5 and received by the light receiving optical system 10b. A signal therefrom is sent to a signal detection processing means 12. Deviation of the surface of the substrate 5 with respect to the control target position (target position in the Z-direction) of the automatic focusing is calculated by the signal detection processing means 12 and sent to the control means 13. The control means 13 moves the Z-axis drives 9a, 9b and 9c based on the deviation information to adjust the surface of the substrate 5 to be at the control target position. Also, a reference plate 14 having an almost flat surface is arranged on the substrate table 8. When calibrating the automatic focusing sensor 10a and 10b, the substrate stage 4 is to be moved to a position so that the position of the reference plate 14 in the Z-axis direction is measurable. Hereinafter, the position is referred to as a calibration position of the substrate stage 4.

Next, an interferometer 20 for calibrating changes of the automatic focusing sensor will be explained.

A laser light source 201 having a stabilized wavelength emits a laser beam wherein polarized lights of two frequencies perpendicularly intersect. The beam irradiates on a polarization beam splitter 202 and divided to perpendicularly intersecting polarized components, that is two frequency components.

Among the above, P-polarized components (frequency components F1) of an incident beam transmits a polarization beam splitter 202, converted to a circular polarized light by a quarter-wave plate 203 to proceed horizontally, irradiates on a bending mirror 204 provided on the movable plate 7, and bent by 90° to proceed upward in the Z-axis direction.

An aperture 205 for beam transmission is provided on the substrate table 8, and the transmitted light irradiates on a measurement mirror 206 fixed on the projection optical system 3.

A beam reflected on the measurement mirror 206 inversely proceeds the same light path, passes through the beam transmission aperture 205, bent by 90° by the bending mirror and transmits through the quarter-wave plate 203 again to be converted to a straight polarized light in the perpendicular direction with respect to the original polarization direction, irradiates on the polarization beam splitter 202 and then reflected to irradiate on a corner cube prism 207.

The reflected beam wherein its optical axis is shifted sideways by the corner cube prism 207 reflects on the polarization beam splitter 202, converted to be a circular polarized light again by the quarter-wave plate 203 and proceeds toward the substrate table 8. This time also the beam traces completely the same path excepting that the optical axis is shifted sideways, and a returned beam is in the same polarized direction with the original incident beam, passes the polarization beam splitter 202 and irradiates on the photoelectronic conversion device 208.

On the other hand, S-polarized components (frequency components F2) in the incident beam is first reflected by the polarization beam splitter 202, bent by 90° by a bending mirror 209, converted to be a circular polarized light by the quarter-wave plate 210 to proceed horizontally, and bent by 90° to proceed upward in the Z-axis direction. On the back side of the substrate table 8 is provided a measurement mirror 211 and the above beam irradiates on the measurement mirror 211.

The beam reflected on the measurement mirror 211 proceeds the same light path inversely and again passes through the quarter-wave plate 210 to be converted to be a straight polarized light perpendicularly intersecting with respect to the originally polarized direction and bent by 90° by the bending mirror 209 to proceed upward in the Z-direction. The beam irradiates on the polarization beam splitter 202, but this time, it transmits the same and irradiates on the corner cube prism 207.

The reflected beam wherein its optical axis is shifted sideways by the corner cube prism 207 transmits the polarization beam splitter 202, bent by 90° by the bending mirror 209, converted to be a circular polarized light again by the quarter-wave plate 210, and proceeds to the measurement mirror 211 on the back side of the substrate table 8. This time also, the beam traces completely the same path excepting that the optical axis is shifted sideways, and the returned beam is made to be in the same polarization direction as the original irradiation beam by the quarter-wave plate 210, reflected on the polarization beam splitter 202 and irradiates on the photoelectronic conversion device 208.

Inside the photoelectronic conversion device 208, the both polarized components are interfered with light polarizer, an interference light is detected by photoelectronic element, the frequency is converted to an electric signal of F2−F1 and sent to a phase detection means 212. The phase detection means 212 is a phase measuring instrument for detecting an absolute phase difference between a reference signal sent from a laser light source 201 and the measurement signal. Namely, the interference light subjected to photoelectronic conversion by the photoelectronic conversion device 208 is input to the phase detection means 212 as a measurement signal having a frequency of a sum of a beat frequency of F2−F1 and a frequency change ΔF(t) of an amount of the Doppler effect caused by changes of a distance between the measurement mirrors 206 and 211. On the other hand, the signal having a beat frequency of F2−F1 obtained by interfering the light of the frequency F1 and the light of the frequency F2 from the laser light source 201 is input as a reference signal to the phase detection means 212. Then, in the phase detection means 212, a phase difference between the reference signal and the measurement signal is detected, and by totaling a change amount of the phase difference, a signal being proportional to the change amount of the distance between the measurement mirrors 206 and 211 can be obtained.

In this way, when the distance between the mirrors 206 and 211 changes, an absolute phase also changes being proportional thereto, so it is possible to measure the change amount of the distance between the mirrors 206 and 211 from the absolute phase difference.

When setting the measured change amount of the absolute phase as $\Delta\phi$ and a wavelength of the laser light source as $\lambda$, $\Delta Z = \Delta\phi \times (\lambda/4)$ stands in a relationship with the change amount $\Delta Z$ of the distance between the mirrors.

In this method, even if the substrate stage 4 moves and the beam from the interferometer 20 temporarily stops, it is possible to measure the absolute phase by moving the substrate stage 4 to the same position again (the calibration position shown in FIG. 1). Accordingly, when the change in a measurement time interval is small and the phase change can be assumed to be within ±π, the change can be correctly traced. For example, when using a He—Ne laser as the laser light source, the wavelength is 633 nm, so the change in the measurement time interval of within ±λ/8, that is, ±79.125 nm would be sufficient. Such kind of exposure apparatuses are generally provided inside an environmental chamber to be under temperature control, and even when assuming that the measurement time interval is about one hour, the temperature change during the measurement interval is extremely small, it is considered that the change falls in the range without any troubles.

Note that since the phase of the interferometer 20 changes also when the refractive index of the environment gas atmosphere inside the exposure apparatus, it is preferable to separately provide a means for measuring the refraction index to correct the change by calculation.

Here, a supplemental explanation of calibration of automatic focusing sensor will be made.

First, a first-time calibrating operation is executed at the time of starting operation of an exposure apparatus. In the first-time calibrating operation, a focal position (an image forming position of a pattern image) of a projection optical system 3 is actually measured. The measurement information is sent to a signal processing means 12 and a control target position of automatic focusing is made to be the same with the actually measured the focal position of the projection optical system 3. Next, the substrate stage 4 is positioned at the calibration position shown in FIG. 1, and focus adjusting of a reference plate 14 is performed by using automatic focusing sensor 10a and 10b. As a result, a surface of the reference plate 14 registers with the control target position (a focal position of the projection optical system 3) of the automatic focusing. A distance $Z_0$ between measurement mirrors 206 and 211 is measured by using an interferometer 20 in this state. The measured distance between the mirrors becomes a reference distance of when there is no change of the automatic focusing sensor 10a and 10b. When the measurement of the reference distance is completed, the first-time calibrating operation ends.

A second-time calibrating operation is performed at predetermined time intervals or after performing processing on a predetermined number of substrate.

First, the substrate stage 4 is moved to the calibration position again, and focus adjusting of the reference plate 14 is performed by using the automatic focusing sensor 10a and 10b. As a result, the surface of the reference plate 14 registers with the control target position of the automatic focus. Furthermore, the distance between the measurement mirrors 206 and 211 is measured by using the interferometer 20 in this state.

If there is no change of the automatic focusing sensor 10a and 10b between the first-time calibrating operation and the second-time calibrating operation, the distance between the measurement mirrors 206 and 211 becomes the distance $Z_0$ measured in the first-time operation, while when there is a change in the automatic focusing sensor 10a and 10b, the distance between the measurement mirrors 206 and 211 is to be changed from $Z_0$.

Information ($\Delta Z$) of the change of the distance between the measurement mirrors 206 and 211 is sent to a central arithmetic processing apparatus 213 and from which sent to the signal detection processing means 12 in the Z-axis direction as an offset instruction of the control target position of automatic focusing. As a result, error components in the Z-axis direction due to optical or mechanical drift(change) of the automatic focusing sensor 10a and 10b can be corrected. Namely, it becomes possible to reduce an error in focus adjustment and the surface of the substrate 5 can be correctly registered with the focal position of the projection optical system 3.

In a third-time calibrating operation and on, it is sufficient to change the control target position of the automatic focusing sensor 10a and 10b by measuring the distance between the measurement mirrors 206 and 211 and comparing the same with the distance of the mirrors measured at the previous calibration.

Note that in the above embodiment, the distance between the measurement mirrors 206 and 211 is measured after adjusting a focus of the reference plate 14 to detect the change of the automatic focusing sensor 10a and 10b at the second-time calibrating operation, but the change of the automatic focusing sensor 10a and 10b may be detected by obtaining a deviation between the control target position of the automatic focusing sensor 10a and 10b and the surface of the reference plate 14 in a state where position of the substrate table 8 in the Z-direction is adjusted so that the distance between the measurement mirrors 206 and 211 becomes $Z_0$.

Note that the change can be obtained from the reference interval $Z_0$ of the distance between the measurement mirrors 206 and 211 in the central arithmetic processing apparatus 213, so if the change becomes too large, it may be obtained by actually measuring the focal position of the projection optical system 3.

Also, a movable plate 7 inclines due to a slight winding of the surface of the base 6, but it doesn't affect the measurement result since calibration is operated always at the same position. Also, when a posture (inclination) of the substrate table 8 changes at the time of calibrating the automatic focusing sensor 10a and 10b, the distance between the measurement mirrors 206 and 211 also changes because positions of the measurement mirrors 206 and 211 are close to an end of the substrate table 8. Accordingly, it is necessary that the posture of the substrate table 8 at the time of calibrating is always the same. At this time, the posture of the substrate table 8 can be accurately obtained by measuring a mirror provided on the side surface by a differential type interferometer, so the posture of the substrate table 8 can be controlled based on the measured value, or the measured value of the distance between the measurement mirrors 206 and 211 may be corrected by calculation.

Furthermore, the posture of the substrate table 8 at the time of calibrating the automatic focusing sensor 10a and 10b may be controlled by using an encoder for measuring respective drive amounts of the Z-drive devices 9a, 9b and 9c.

Also, a laser light source of a laser measuring machine used for position controlling of the substrate table 8 in the XY-direction can be commonly used for the laser interferometer 20 used for correcting the automatic focusing sensor 10a and 10b, and thereby, it is possible to suppress the cost of the apparatus.

Second Embodiment

Figure 2:
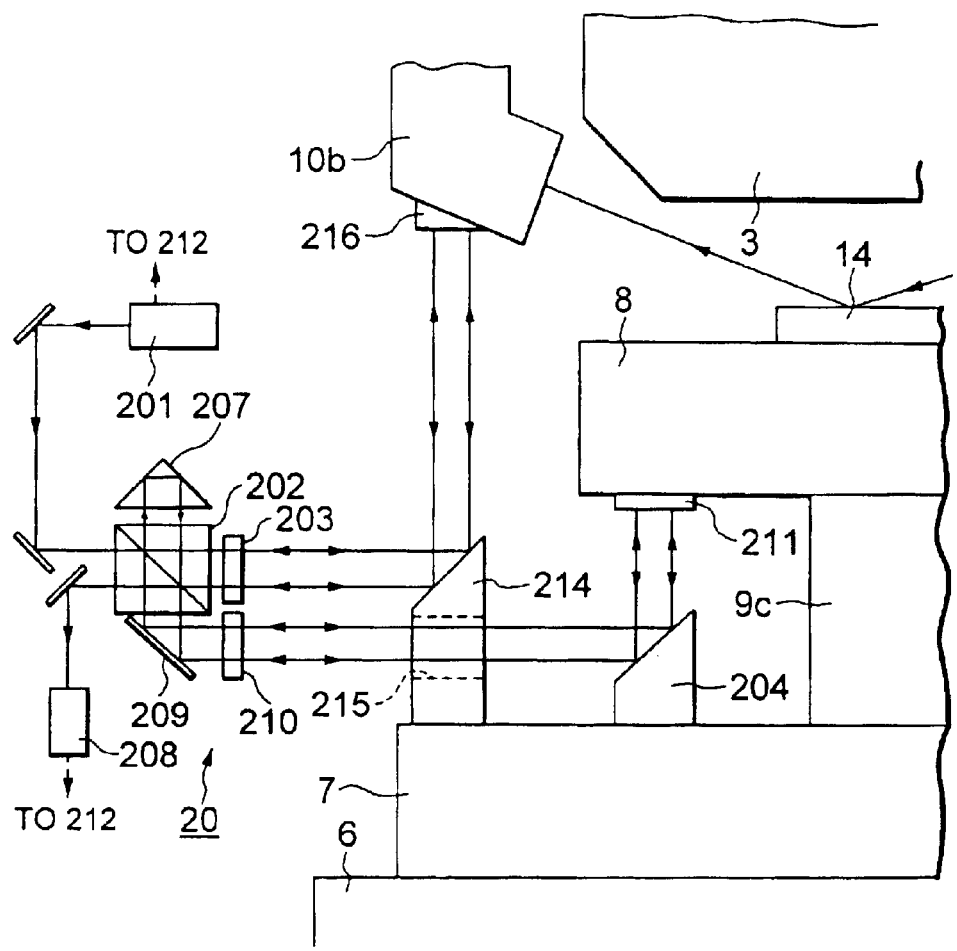
FIG. 2 is a schematic view of a core part of an exposure apparatus according to a second embodiment of the present invention.

FIG. 2 is a schematic view of another embodiment of an exposure apparatus of the present invention and shows only a core portion. In the present embodiment, the measurement mirror 216 of the interferometer 20 is provided on the automatic focusing sensor 10a and 10b (a light receiving optical system 10b is shown in FIG. 2). Note that an illustration of the configuration of the interferometer 20 in FIG. 1 is omitted in FIG. 2.

Namely, the laser light source 201 having a stabilized wavelength emits a laser beam wherein polarized lights of two frequencies perpendicularly intersect. The beam irradiates on the polarization beam splitter 202 and divided to perpendicularly intersecting polarization light components, that is, two frequency components.

Among them, P-polarization components (frequency components F1) of the incident beam transmits the polarization beam splitter 202, converted to be a circular polarized light by the quarter-wave plate 203 to horizontally proceed, irradiates on the bending mirror 214 provided on the movable plate 7, bent to be 90° to proceed upward in the Z-axis direction. The beam irradiates the measurement mirror 216 fixed on the light receiving optical system 10b.

The beam reflected on the measurement mirror 216 proceeds the same light path inversely, bent by 90° by the bending mirror 214 and passes through the quarter-wave plate 203 again, consequently, it is converted to be a straight polarized light in a direction perpendicularly intersecting with respect to the original polarized direction, irradiates on the polarization beam splitter 202, then reflected to irradiate on the corner cube prism 207.

The reflected beam wherein the optical axis is shifted sideways by the corner cube prism 207 is reflected on the polarization beam splitter 202, converted to be a circular polarized light by the quarter-wave plate 203 and proceeds to the bending mirror 214. This time also, the beam traces completely the same path excepting that the optical axis was shifted sideways, and the returned beam becomes to be in the same polarization direction as the original incident beam by the quarter-wave plate 203, transmits the polarization beam splitter 202 and irradiates on the photoelectronic conversion device 208.

On the other hand, S-polarization components (frequency components F2) is reflected first by the polarization beam splitter 202, bent by 90° by the banding mirror 209, converted to be a circular polarized light by the quarter-wave plate 210 and proceeds horizontally. On a support plate of the bending mirror 214 is formed a beam transmission aperture 215 and the above beam transmits the aperture 215, then irradiates on the bending mirror 204 provided on the movable plate 7, bent by 90° and proceeds upward in the Z-axis direction. On the backside of the substrate table 8 is provided a measurement mirror 211 and the above beam irradiates on the measurement mirror 211.

The beam reflected on the measurement mirror 211 inversely proceeds the same light path and transits through the quarter-wave plate 210 again, consequently, converted to be a straight polarized light in a direction perpendicularly intersecting with respect to the original polarization direction, bent by 90° by the bending mirror 209 and proceeds upward in the Z-axis direction. The beam irradiates on the polarization beam splitter 202 and this time transmits the same and irradiates on the corner cube prism 207.

The reflected beam wherein the optical axis is shifted sideways by the corner cube prism 207 transmits the polarization beam splitter 202, bent by 90° by the bending mirror 209, converted to be a circular polarization light by the quarter-wave plate 210 again and proceeds to the measurement mirror 211 on the backside of the substrate table 8 via the beam transmission aperture 215. This time also, the beam traces completely the same path excepting that the optical axis is shifted sideways, and the returned beam becomes to be in the same polarization direction as the original incident beam by the quarter-wave plate 210, reflected on the polarization beam splitter 202 and irradiates on the photoelectronic conversion device 208.

Inside the photoelectronic conversion device 208, in the same way as in the above first embodiment, the both polarization components are interfered by the polarizer, the interference light is detected by a photoelectronic element, converted to an electric signal having a frequency of F2–F1, sent to the phase detection means 212, and an amount of change of the distance between the both mirrors 216 and 211, that is, changes of the substrate table 8 and the light receiving optical system 10*b* in the Z-axis direction are obtained by the phase detection means 212.

In the present embodiment, since the change of the light receiving optical system 10*b* and the substrate table 8 in the Z-axis direction are measured, error components of the automatic focus sensor 10*a* and 10*b* in the Z-axis direction due to an optical to mechanical drift(change) can be more accurately corrected.

Third Embodiment

Figure 3:
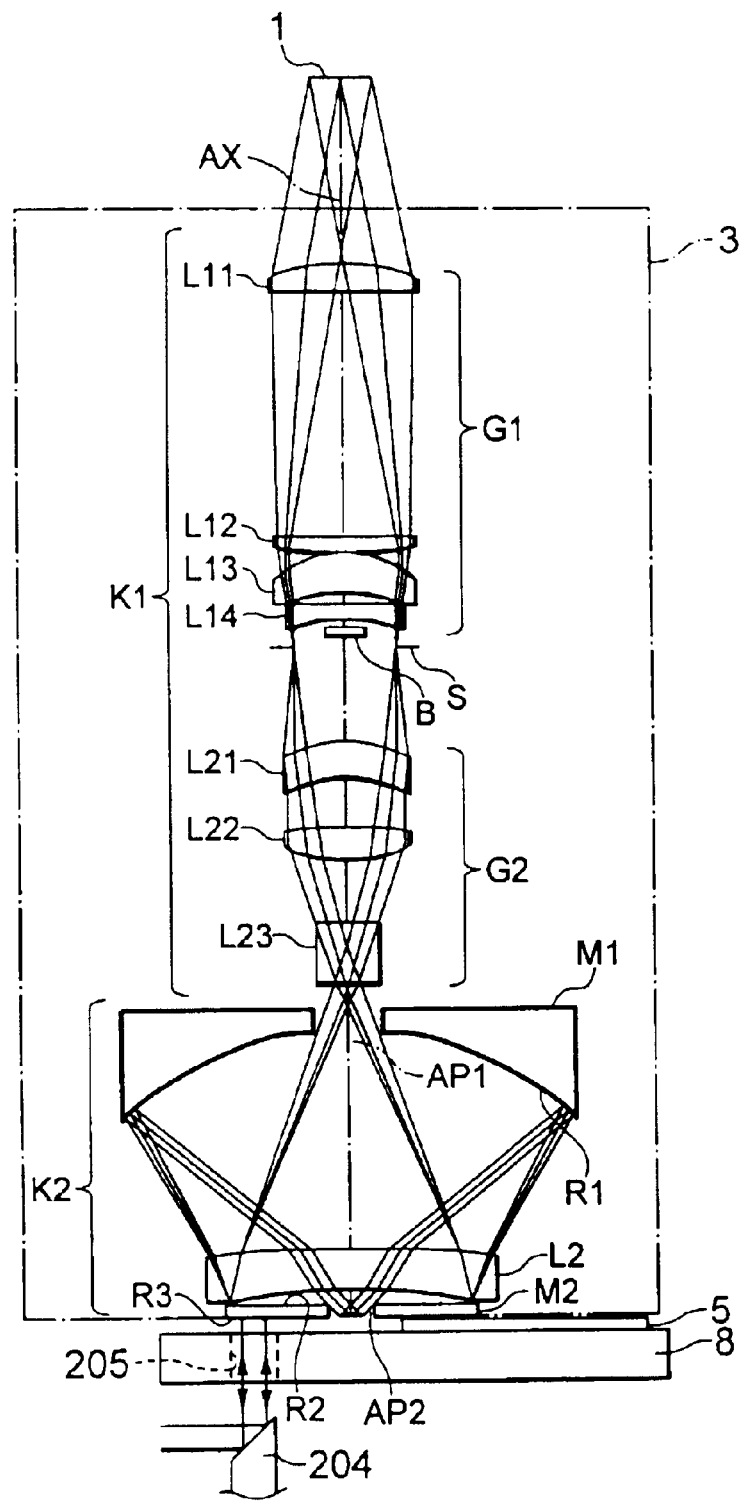
FIG. 3 is a schematic view of a core part of an exposure apparatus according to a third embodiment of the present invention.

FIG. 3 is a schematic view of a core part according to a third embodiment of an exposure apparatus of the present invention, and mainly shows the lens structure of a projection optical system (hereinafter also referred to as catadioptric system). In the present embodiment, a projection optical system 3 wherein various aberration including color aberration are corrected on an exposure light having a wavelength width of 157.6 nm±10 pm is used.

The catadioptric system 3 in FIG. 3 comprises a first image forming optical system K1 of a refraction type for forming an interim image of a mask 1 and a second image forming optical system K2 of a reflection refraction type for forming a final image of the mask 1 in a reduced rate on the substrate 5 based on a light from the interim image. The first image forming optical system K1 comprises a first lens group G1 of a positive refractive power, an aperture stop S, a second lens group G2 of positive refractive power in an order from the mask 1 side. The second image forming optical system K2 comprises a main mirror M1 having a first reflection surface R1 of a negative refractive power being formed a first light transmission portion AP1 at the center, a sub mirror M2 having a second reflection surface R2 being formed a second light transmission portion AP2 at the center, and a lens components L2 having a refraction surface facing its concave surface to the substrate side positioned to be away from the first reflection surface R1 and the second reflection surface R2. Note that a third reflection surface R3 is formed on the sub mirror M2 on the surface facing to the substrate 5 side thereof.

The first lens group G1 comprises, in an order from the mask 1 side, a meniscus lens L11 facing its convex surface of a non-spheric shape to the mask 1 side, a meniscus lens L12 facing its convex surface of a non-spheric shape to the substrate 5 side, a both-side convex lens L13 facing its non-spheric shaped convex surface to the mask 1 side, and a meniscus lens L14 facing its non-spheric shaped concave surface to the substrate 5 side.

Also, the second lens group G2 comprises in an order from the mask 1 side, a meniscus lens L21 facing its non-spheric shaped convex surface to the mask 1 side, a both-side convex lens L22 facing its non-spheric shaped convex surface to the substrate 5 side, and a meniscus lens L23 facing its non-spheric shaped concave surface to the substrate 5 side.

Furthermore, the second image forming optical system K2 includes a negative meniscus lens L2 facing its non-spheric shaped concave surface to the substrate 5 side. Also the first image forming optical system K1 comprises a center shielding member B arranged at a different position from the aperture stop S in an optical axis AX direction for shielding a light near the optical axis AX.

In the above configuration, a light from the first image forming optical system K1 is reflected on the second reflection surface R2 via the first light transmission portion AP1 of the main mirror M1 and the lens components L2, a light reflected on the second reflection surface R2 is reflected on the first reflection surface R1 via the lens components L2, and the light reflected on the first reflection surface R1 forms a final image on the substrate 5 via the lens components L2 and the second light transmission portion AP2 of the sub mirror M2.

In the present embodiment, the third reflection surface R3 of the sub mirror M2 of the above catadioptric system 3 is used and the third reflection surface R3 instead of the measurement mirror 206 shown in FIG. 1 is used as a reflection surface on the projection optical system 3 side of the interferometer 20.

By doing so, changes of the projection optical system 3 and the substrate table 8 in the Z-axis direction can be obtained in the same way as in the above first embodiment without separately providing the measurement mirror 206. As a result, it is possible to correct erroneous components of the automatic focusing sensor 10*a* and 10*b* in the Z-axis direction due to an optical or mechanical change. Note that the measurement mirror 216 shown in the second embodiment can be also provided to the automatic focusing sensor 10*a* and 10*b* in this case.

According to the embodiment explained above, the surface (an exposure surface) of the substrate 5 can be accurately registered with the focal position (an image forming position of the pattern image) of the projection optical system and a pattern image of a mask can be preferably transferred on the substrate.

A substrate subjected to the exposure processing using the above exposure apparatus is performed image developing processing, pattern forming processing, such as etching processing, and resist removing processing, then through processing of dicing, bonding, packaging, etc., a device is produced.

Note that the embodiments explained above were described to facilitate the understanding of the present invention and not to limit the present invention. Accordingly, elements disclosed in the above embodiments include all design modifications and equivalents belonging to the technical field of the present invention.

As explained above, an exposure apparatus capable of correcting changes of an automatic focusing sensor accurately at a high speed can be provided.

An exposure apparatus capable of accurately adjusting a substrate surface (exposure surface) to register with a focal position (an image forming position of a pattern image) of a projection optical system and preferably transferring the pattern image of the mask on the substrate can be provided.

Also, by applying such an exposure apparatus to production of devices, highly accurate devices can be mass-produced at high performance.

This disclosure relates to the matter contained in Japanese Patent Applications No. 11-265669 filed on Sep. 20, 1999 and No. 2000-259147 filed on Aug. 29, 2000. All of that disclosure is incorporated here by reference.

What is claimed is:

1. An exposure apparatus in which an image of a pattern formed on a mask is projected onto a substrate via a projection optical system, comprising:

a substrate stage;

a reference plate on the substrate stage;

a first sensor having a projector and a receiver, which measures a gap in an optical axis direction between a surface of said substrate held by said substrate stage and a control target position during exposure of the substrate, and said first sensor also measures positional information of a surface of said reference plate in the optical axis direction; and a second sensor having a reflector secured to said projection optical system and a bending reflection surface which directs a detecting light to the reflector, that detects a distance between said projection optical system and said substrate stage in the optical axis direction, wherein the substrate stage is positioned at a predetermined position while the first sensor measures the position of said reference plate and while the second sensor detects the distance, so that the measurement result of the first sensor and the detection result of the second sensor are related with each other.

2. The exposure apparatus according to claim 1, wherein a positional relationship between the projection optical system and the surface of the substrate is adjusted based on the positional information of the reference plate measured by the first sensor and the distance detected by the second sensor.

3. The exposure apparatus according to claim 2, wherein the control target position of the first sensor is corrected based on the positional information of the reference plate measured by the first sensor and the distance detected by the second sensor.

4. The exposure apparatus according to claim 1, wherein said second sensor includes:

an interferometer unit that emits the detecting light, and receives a reflection light from the reflector so as to detect said distance.

5. The exposure apparatus according to claim 4, wherein the substrate stage has an opening for the detecting light and the reflection light to transmit through.

6. An exposure apparatus in which an image of a pattern formed on a mask is projected onto a substrate via a projection optical system, comprising:

a substrate stage;

a reference plate on the substrate stage;

a position measuring system which measures a position of a surface of said substrate held by said substrate stage in an optical axis direction of said projection optical system during exposure of the substrate, the position measuring system also measuring a position of a surface of the reference plate in the optical axis direction;

a moving system which moves said substrate stage in the optical axis direction based on a measurement result by the position measuring system; and a correction system which measures a change of a distance between said projection optical system and said substrate stage in said optical axis direction and corrects a position of the surface of said substrate in said optical axis direction using said position measuring system and said moving system based on the measured change, and wherein the substrate stage is positioned at a predetermined position while the position measuring system measures the position of the surface of the reference plate and while the correction system measures the change of said distance.

7. The exposure apparatus according to claim 6, wherein said correction system comprises a sensor which measures a distance between a first reference surface of said projection optical system and a second reference surface of said substrate stage to measure the distance between said projection optical system and said substrate stage.

8. The exposure apparatus according to claim 7, wherein said first reference surface and said second reference surface are flat mirrors, and said sensor is an interferometer.

9. The exposure apparatus according to claim 6, wherein an inclined state of said substrate stage is always the same when measuring the distance between said projection optical system and said substrate stage in said optical axis direction.

10. An exposure apparatus in which an image of a pattern formed on a mask is projected onto a substrate via a projection optical system, comprising:

a substrate stage;

a reference plate on the substrate stage;

a position measuring system which measures a position of a surface of said substrate held by said substrate stage in an optical axis direction of said projection optical system during exposure of the substrate, the position measuring system also measures a position of a surface of the reference plate in the optical axis direction;

a moving system which moves said substrate stage in the optical axis direction based on a measurement result by the position measuring system; and a correction system which measures a change of a distance between said position measuring system and said substrate stage in said optical axis direction and corrects a position of the surface of said substrate in said optical axis direction using said position measuring system and said moving system based on the measured change, and wherein the substrate stage is positioned at a predetermined position while the position measuring system measures the position of the surface of the reference plate and while the correction system measures the change of said distance.

11. A method of producing devices including exposing a substrate to at least one pattern image utilizing the exposure apparatus according to claim 1.

12. A method of producing devices including exposing a substrate to at least one pattern image utilizing the exposure apparatus according to claim 6.

13. A method of producing devices including exposing a substrate to at least one pattern image utilizing the exposure apparatus according to claim 10.

14. An exposure apparatus in which an image of a pattern formed on a mask is projected onto a substrate via a projection optical system, comprising:

a substrate stage which is movable;

a reference plate on the substrate stage;

a first sensor system having a projector and a receiver, which measures positional information of a surface of said reference plate in an optical axis direction, said reference plate being under the projection optical system;

a second sensor system having a reflector secured to said projection optical system and a bending reflection surface on the substrate stage which directs a detecting light to the reflector, that detects positional information of the reflector in the optical axis direction; and wherein the substrate stage is positioned at a predetermined position while the first sensor system measures said positional information of said reference plate surface and while the second sensor system detects said positional information of the reflector, so that the measurement result of the first sensor system and the detection result of the second sensor system are related with each other.

15. The exposure apparatus according to claim 14, wherein a positional relationship between the projection optical system and a surface of the substrate is adjusted based on said positional information of the surface of the reference plate measured by the first sensor system and said positional information of the reflector detected by the second sensor system.

16. The exposure apparatus according to claim 15, wherein the second sensor system has an interferometer unit which receives a reflection light from said reflector in order to detect the positional information of the reflector in the optical axis direction.

17. The exposure apparatus according to claim 16, wherein the substrate stage includes a table on which the substrate is held, a stage base, and a plurality of actuators which move the table relative to the stage base plate.

18. The exposure apparatus according to claim 17, wherein the reference plate is on the table.

19. The exposure apparatus according to claim 18, wherein the bending reflection surface is on the stage base plate.

20. The exposure apparatus according to claim 18, wherein the second sensor system has a reflection member arranged on the table, and the interferometer unit receives the reflection light from the reflector secured to the projection optical system and a reflection light from the reflection member arranged on the table.

21. The exposure apparatus according to claim 16, wherein the first sensor system measures a deviation between a target position and the surface of the reference plate as the positional information by projecting a measuring light onto the reference plate and by receiving a reflection light from the reference plate.

22. The exposure apparatus according to claim 21, wherein the first sensor system also measures positional information of the surface of the substrate in the optical axis direction during exposure of the substrate.

23. The exposure apparatus according to claim 16, wherein the interferometer unit includes a corner-cube reflection member which reflects the reflection light from the reflector via the bending reflection surface.

24. The exposure apparatus according to claim 23, wherein the first sensor system also measures positional information of the surface of the substrate in the optical axis direction during exposure of the substrate.

25. The exposure apparatus according to claim 16, wherein the first sensor system also measures positional information of the surface of the substrate in the optical axis direction during exposure of the substrate.

26. A micro-device manufacturing method including exposing a substrate to at least one pattern image utilizing the exposure apparatus defined in claim 14.

* * * * *